United States Patent
Steinle (10) Patent No.: US 7,125,733 B2
(45) Date of Patent: Oct. 24, 2006

(54) METHOD FOR PRODUCING AN OPTICAL EMISSION MODULE HAVING AT LEAST TWO VERTICALLY EMITTING LASERS

(75) Inventor: Gunther Steinle, Munich (DE)

(73) Assignee: Infineon Technologies AG, Munich (DE)

( * ) Notice: Subject to any disclaimer, the term of this patent is extended or adjusted under 35 U.S.C. 154(b) by 265 days.

(21) Appl. No.: 10/840,826

(22) Filed: May 6, 2004

(65) Prior Publication Data

US 2005/0151137 A1    Jul. 14, 2005

Related U.S. Application Data

(60) Provisional application No. 60/536,605, filed on Jan. 13, 2004.

(51) Int. Cl.
*H01L 21/465* (2006.01)
(52) U.S. Cl. .................. 438/23; 438/29; 438/39; 438/737
(58) Field of Classification Search .......... 438/23
See application file for complete search history.

(56) References Cited

U.S. PATENT DOCUMENTS

| | | | | |
|---|---|---|---|---|
| 5,478,774 | A | * | 12/1995 | Ackley et al. ............... 438/39 |
| 5,557,626 | A | * | 9/1996 | Grodzinski et al. ....... 372/45.01 |
| 5,877,038 | A | * | 3/1999 | Coldren et al. ............... 438/39 |
| 6,046,065 | A | * | 4/2000 | Goldstein et al. ............ 438/46 |
| 6,156,582 | A | * | 12/2000 | Shieh et al. .................. 438/29 |
| 6,620,642 | B1 | | 9/2003 | Dudoff et al. |
| 6,979,582 | B1 | * | 12/2005 | Horng et al. ................. 438/27 |
| 2002/0041741 | A1 | | 4/2002 | Ciemiewicz |
| 2002/0150135 | A1 | * | 10/2002 | Naone et al. ................. 372/45 |

FOREIGN PATENT DOCUMENTS

WO    WO 03/003619 A2    1/2003

* cited by examiner

*Primary Examiner*—Stephen W. Smoot
(74) *Attorney, Agent, or Firm*—Eschweiler & Associates, LLC (57) ABSTRACT

A method for producing an emission module having at least two vertically emitting lasers in which an optically active laser layer is arranged on a substrate and at least one upper covering layer is arranged on said laser layer. In a first etching step, upper mesa regions are formed by etching the upper covering layer, wherein the etching depth of the first etching step is chosen such that the first etching step is ended above the optically active laser layer, and the first etching step is carried out such that the resulting distance between adjacent upper mesa regions is so small that the radiation generated by the finished lasers can be coupled directly into a single optical waveguide. In a second etching step, the optically active layer is severed to form lower mesa regions, the second etching step being a wet-chemical or dry-chemical etching step with a predominantly chemical etching component.

12 Claims, 10 Drawing Sheets

METHOD FOR PRODUCING AN OPTICAL EMISSION MODULE HAVING AT LEAST TWO VERTICALLY EMITTING LASERS

RELATED APPLICATION

The present application claims priority of U.S. Patent Application Ser. No. 60/536,605 filed by Gunther Steinle on Jan. 13, 2004.

FIELD OF THE INVENTION

The invention relates to an optical emission module, in particular to a redundant optical emission module, having at least two vertically emitting lasers, and to a method for producing such an emission module.

BACKGROUND OF THE INVENTION

A redundant emission module is described in the laid-open document with respect to the U.S. patent application 2002/0041741 A1. The emission module has a laser array having a plurality of laser cells. A respective laser is arranged in each laser cell. The arrangement of the lasers within their respective laser cell is chosen in such a way that at least two lasers directly couple their light into one and the same optical waveguide.

The U.S. Pat. No. 6,620,642 B1 and the international patent application W003/003619 A2 describe a redundant optical emission module in which the lasers of the emission module are separated from one another by etched trenches.

SUMMARY OF THE INVENTION

The invention is directed to a method for producing an emission module having at least two vertically emitting lasers. The method is intended to ensure that the distances between the vertically emitting lasers can be dimensioned to be so small that at least two vertically emitting lasers can directly couple their light into one and the same optical waveguide.

Moreover, the method according to the invention is intended to ensure that crystal damage which might impair the electrical and optical behavior of the vertically emitting lasers is avoided during the production process.

Accordingly, the invention provides a method for producing an optical emission module having at least two vertically emitting lasers. In the method, an optically active laser layer is arranged on a substrate and at least one upper covering layer is arranged on said laser layer. In a first etching step, an upper mesa region is in each case etched for the lasers to be produced. The etching depth of said first etching step is chosen in such a way that the first etching step is ended above the optically active laser layer. The first etching step is carried out in such a way that the resulting distance between the upper mesa regions of the lasers is so small that the radiation generated by the finished produced lasers can be coupled into one and the same optical waveguide. In a second etching step, the optically active laser layer is severed to form lower mesa regions. The second etching step is a wet-chemical or dry-chemical etching step with a predominantly chemical etching component.

One essential advantage of the method according to the invention is that the method is carried out in two stages, that is to say in at least two etching steps. By virtue of the two etching stages of the production method, two different method aims can be achieved simultaneously, namely on the one hand a minimum distance between the vertically emitting lasers and on the other hand an optimum quality of the vertically emitting lasers or an optimum electrical and optical behavior of the lasers.

The minimum distance between the vertically emitting lasers can be achieved by virtue of the fact that an etching method which achieves a particularly high sidewall steepness of the etching sidewalls is chosen when carrying out the first etching step. Since the optically active laser layer is not yet affected during the first etching step, it is not necessary to show regard for the active laser layer in the optimization of the first etching step. It is thus possible to optimize the first etching step exclusively in respect of a maximum sidewall steepness and a minimum distance between the lasers.

In the second etching step, during which the active laser layer is severed, it is ensured, in contrast to the first etching step, that as little crystal damage as possible occurs in the optically active laser layer. This is achieved according to the invention by virtue of the fact that, during the second etching step, the optically active laser layer is severed in the context of a wet-chemical or dry-chemical etching step with a predominantly chemical etching component. This is because only very little crystal damage which might impair the electrical and/or optical behavior of the vertically emitting lasers occurs during a wet-chemical etching or etching with a predominantly chemical etching component.

The second etching step additionally brings about the severing of the active laser layer between the lasers. This separation prevents crystal damage in one of the lasers from "migrating" through the entire active laser layer to other lasers and forming a "dislocation network". The severing of the active laser layer between the lasers reliably prevents such migration of crystal dislocations.

To summarize, it can thus be established that an optimum electrical and optical behavior of the emission modules is achieved according to the invention by virtue of the fact that the emission modules are produced in a two-stage etching method in which the upper mesa regions above the optically active laser layer are etched by a method which is particularly suitable with regard to a minimum distance between the lasers, whereas the lower mesa regions with the optically active laser layer are treated by an etching method which is optimized with regard to minimum crystal damage.

A particularly small distance between the vertically emitting lasers can be achieved very simply and thus advantageously if the first etching step is a dry-chemical etching step with a predominantly physical etching component; this is because dry-chemical etching methods with a predominantly physical etching component enable a virtually perpendicular etching and a maximum sidewall steepness, so that it is readily possible to separate even very closely adjacent lasers with respect to one another. The crystal damage which possibly arises in this case in the edge region of the etching sidewalls does not directly affect the electrical behavior of the lasers since the active layer of the lasers is not affected by the first etching step.

In order to make sure that the etching sidewalls formed during the etching of the lower mesa regions do not cause any crystal damage which impairs the electrical or optical behavior of the vertically emitting lasers, the lower mesa region is preferably formed with a larger area in cross section than the upper mesa region and a step is produced between the upper and lower mesa regions. This is because a lower mesa region with a particularly large area in cross section ensures that the etching sidewalls are at a greater distance from the center region of the active laser region of the lasers than would otherwise be the case. Thus, in this refinement of the etching method, the etching sidewalls that sever the optically active laser layer are intentionally arranged as far away as possible from the center of the active laser zone in order to minimize the influence of the etching sidewalls on the behavior of the lasers and to optimize the electrical and optical behavior of the lasers.

In order to achieve a monitor diode function of the optical emission module, a monitor diode layer is preferably arranged on the substrate before the application of the active laser layer. This "buried" monitor diode layer thus forms a monitor diode which is arranged backward and is opposite the active output or emission area of the vertically emitting lasers.

If the intention is for each of the vertically emitting lasers to have its own individually assigned monitor diode, the monitor diode layer is severed in the context of the second etching step or a subsequent etching step.

As an alternative, the monitor diode layer may also remain unsevered if a single monitor diode is intended to be assigned to all the vertically emitting lasers.

Moreover, an electrical insulation layer may be arranged between the monitor diode layer and the active laser layer in order to achieve an electrical insulation between the vertically emitting lasers and the monitor diode layer.

In order furthermore to optimize the electrical behavior of the vertically emitting lasers, it is regarded as advantageous if the surface uncovered after the first etching step is oxidized, the oxidation layer is opened outside the upper mesa regions and the second etching step is subsequently carried out. The oxidation results in a passivation of the surface uncovered in the first etching step, thereby significantly improving the electrical behavior in the surface region. By way of example, the density of recombination centers decreases in the surface region, so that overall fewer charge carriers can recombine in the surface region. This leads to a lower current requirement of the vertically emitting lasers and to a longer lifetime of the emission modules.

Moreover, the optical behavior of the vertically emitting lasers can be improved by virtue of the fact that at least one or a plurality of mirror layers are in each case arranged below or above the active laser layer.

The optical emission module is preferably operated in a redundant manner; what is then involved is therefore a "redundant" emission module.

The invention furthermore relates to an optical emission module having at least two vertically emitting lasers.

With regard to such an optical emission module, the invention is based on the object of achieving an as far as possible optimum electrical and optical behavior of the lasers of the emission module.

In order to achieve this object, an optical emission module is provided, in which the lasers have an active laser layer and also a mesa structure with in each case an upper mesa region and in each case a lower mesa region. The lower mesa region has etching sidewalls that are etched chemically or dry-chemically with a predominantly chemical etching component. The active laser layer is in each case arranged in the lower mesa regions of the lasers.

With regard to the advantages of the optical emission module according to the invention, reference is made to the above explanations in connection with the method according to the invention, since the advantages of the method according to the invention essentially correspond to the advantages of the optical emission module according to the invention.

The same applies correspondingly to the advantageous refinements of the optical emission module according to the invention, which are specified in the subclaims relating to the emission module according to the invention.

DETAILED DESCRIPTION OF THE FIGURES

In FIGS. 1 to 10, identical reference symbols are used for identical and comparable components, for the sake of clarity.

Figure 1:
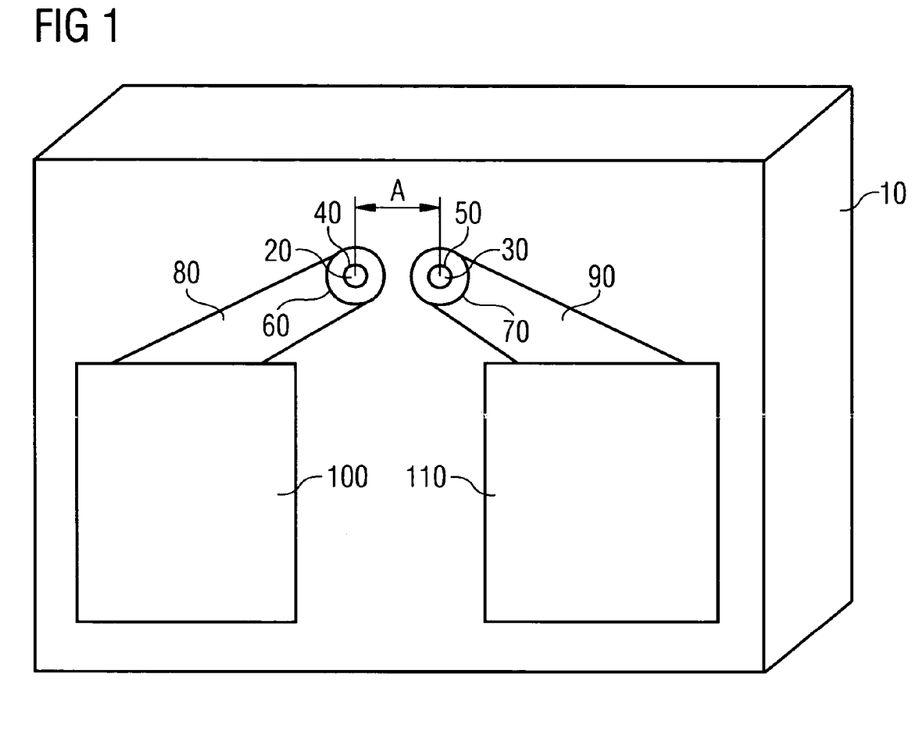
FIGS. 1 and 2 show an exemplary embodiment of an emission module according to the invention with two vertically emitting lasers.

FIG. 1 reveals a substrate 10 with two vertically emitting lasers 20 and 30. The two vertically emitting lasers 20 and 30 are arranged so closely adjacent (distance A) that they can couple their light into one and the same optical waveguide. The optical waveguide is not illustrated in FIG. 1 for the sake of clarity. The two lasers 20 and 30 each have an emission window 40 and 50, respectively. The two emission windows 40 and 50 are respectively surrounded by an annular pad 60 and 70, which are connected to connection pads 100 and 110 via connection lines 80 and 90.

The two connection pads 100 and 110 make it possible to electrically drive the two lasers 20 and 30 individually, that is to say separately from one another. Depending on the driving, the lasers 20 and 30 emit light via their emission windows 40 and 50 and couple said light into the optical waveguide not illustrated in FIG. 1.

Figure 2:
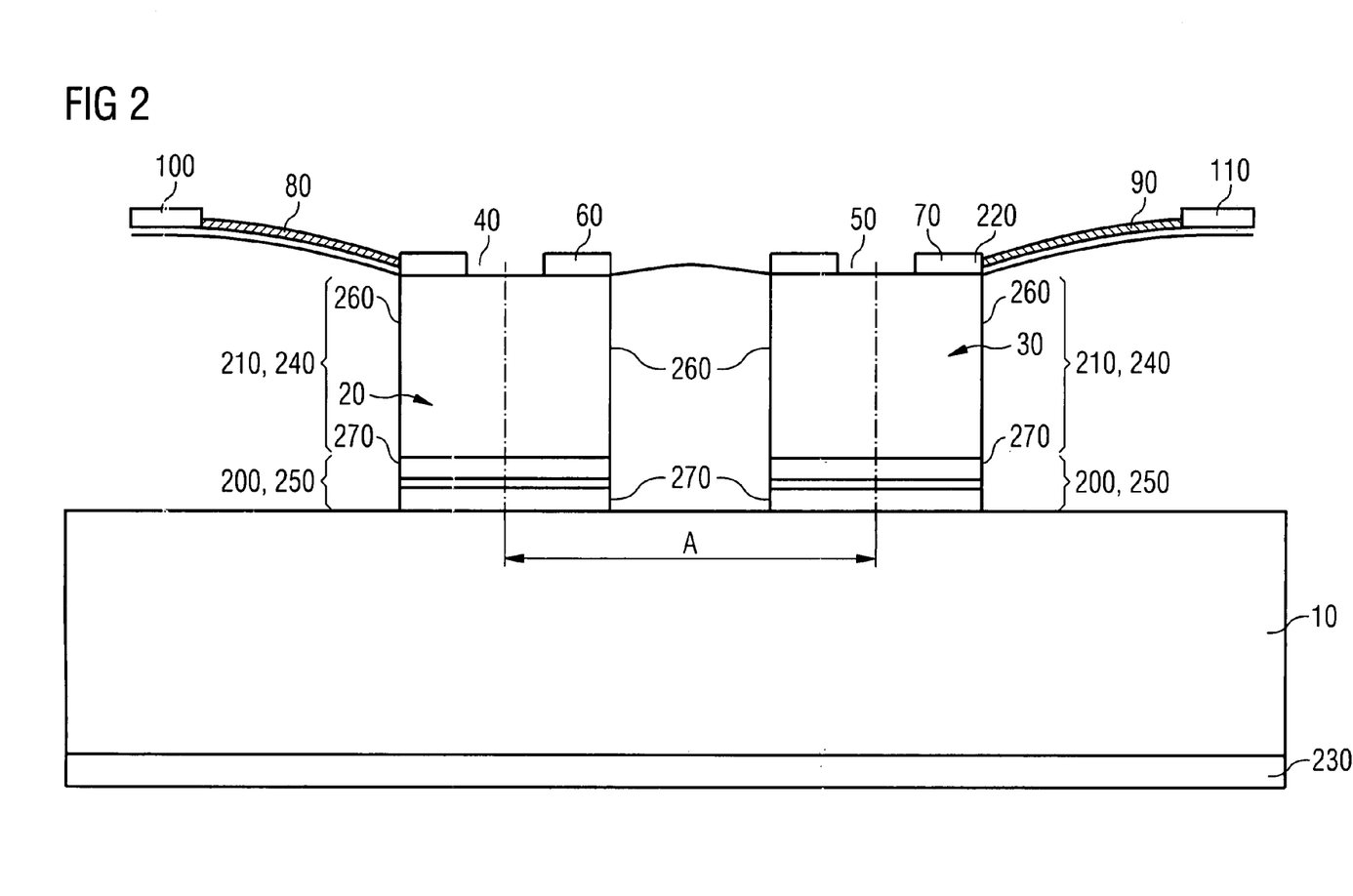

FIG. 2 illustrates the emission module in accordance with FIG. 1 in cross section. The substrate 10 can be seen, on which an active laser layer 200 formed from a plurality of individual layers is arranged. The active laser layer 200 is thus formed by an active layer bundle.

Situated above the active laser layer 200 is an upper covering layer 210 provided with an upper contact layer 220. A lower contact layer 230 is provided at the underside of the substrate 10.

As can be gathered from FIG. 2, an upper and a lower mesa region are etched into the upper covering layer 210 and into the active laser layer 200. The upper mesa region bears the reference symbol 240 in FIG. 2; the lower mesa region is provided with the reference symbol 250.

The upper contact layer 220 is patterned in annular fashion such that the emission windows 40 and 50 already explained in connection with FIG. 1 can be formed. Moreover, FIG. 2 depicts the two connection lines 80 and 90 and also the two connection pads 100 and 110.

Mirror layers or mirror layer bundles may be arranged both in the substrate 10 and in the upper covering layer 210 in order to improve the optical behavior of the vertically emitting lasers 20 and 30. At least one mirror layer in the upper covering layer 210 and at least one mirror layer in the substrate 10 are advantageous for laser operation. The reflectivities of the mirror layers are preferably at least 99%. The mirror layers are preferably formed in each case by a sequence of Bragg mirrors. Bragg mirrors can be formed e.g. by a periodic sequence of layers with a varying or different refractive index, the optical period length of each Bragg mirror being approximately a multiple of half the optical emission wavelength. Preferably, each of the individual layers of the Bragg mirrors has a thickness of precisely one quarter wavelength or an odd multiple of one quarter wavelength. An optical period of the Bragg mirrors is formed e.g. from a plurality of layers, preferably from two layers in each case.

The laser structure in accordance with FIG. 2 is produced in a two-stage etching method: firstly, the upper mesa region 240 is etched in a first etching step by the upper covering layer 210 being partially etched away. The first etching step is terminated still before the active laser layer 200 is affected by the first etching step. The first etching step is preferably a dry-chemical etching step with a predominantly physical etching component. The etching method is optimized in such a way that a maximum sidewall steepness of the etching sidewalls 260 is achieved in the upper mesa region 240. An optimum sidewall steepness is necessary or desirable in order to achieve a particularly dense arrangement of the lasers 20 and 30 next to one another.

The lower mesa regions 250 are etched in a second etching step. In order to ensure that the crystal structure is damaged as little as possible in the region of the etching sidewalls 270 of the lower mesa region 250, that is to say as little crystal damage as possible is caused, the second etching step is carried out by means of a wet-chemical etching method or a dry-chemical etching method with a predominantly chemical etching component. In contrast to the first etching step, in which the etching method is optimized with regard to a maximum sidewall steepness of the etching sidewalls 260, the aim when carrying out the second etching step is to ensure that the resulting etching sidewalls 270 have the least possible crystal damage or other damage which might impair the electrical or optical behavior of the active laser layer 200 and that of the resulting lasers 20 and 30.

As can be seen in FIG. 2, the two lasers 20 and 30 have a common rear contact formed by the lower contact layer 230 of the substrate 10.

Figure 3:
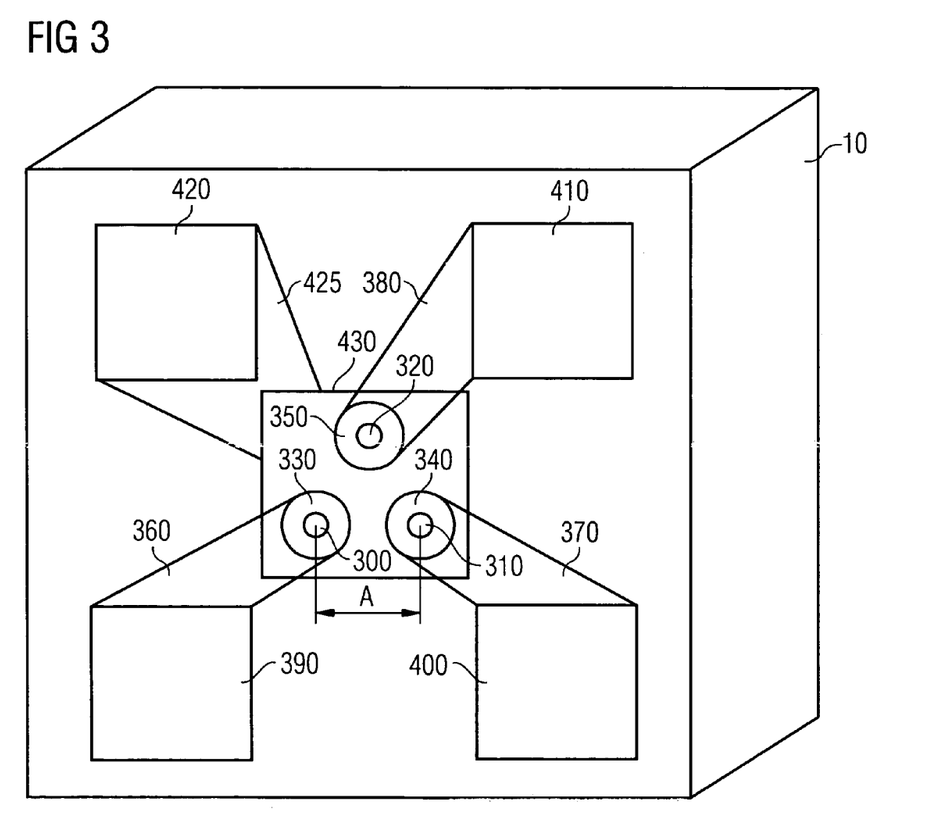
FIGS. 3 and 4 show an exemplary embodiment of an emission module according to the invention with three vertically emitting lasers without steps between mesa regions.

FIG. 3 shows a second exemplary embodiment of an emission module. This emission module has three lasers 300, 310 and 320. The three lasers 300, 310 and 320 are arranged so closely adjacent that they can radiate their light into one and the same optical waveguide. The three lasers 300, 310 and 320 respectively have an annular pad 330, 340 and 350, by which they can be driven via connection lines 360, 370 and 380 and connection pads 390, 400 and 410.

FIG. 3 furthermore reveals a connection pad 420 and a connection line 425, which are provided for electrically driving a monitor diode 430 integrated in the substrate 10.

Figure 4:
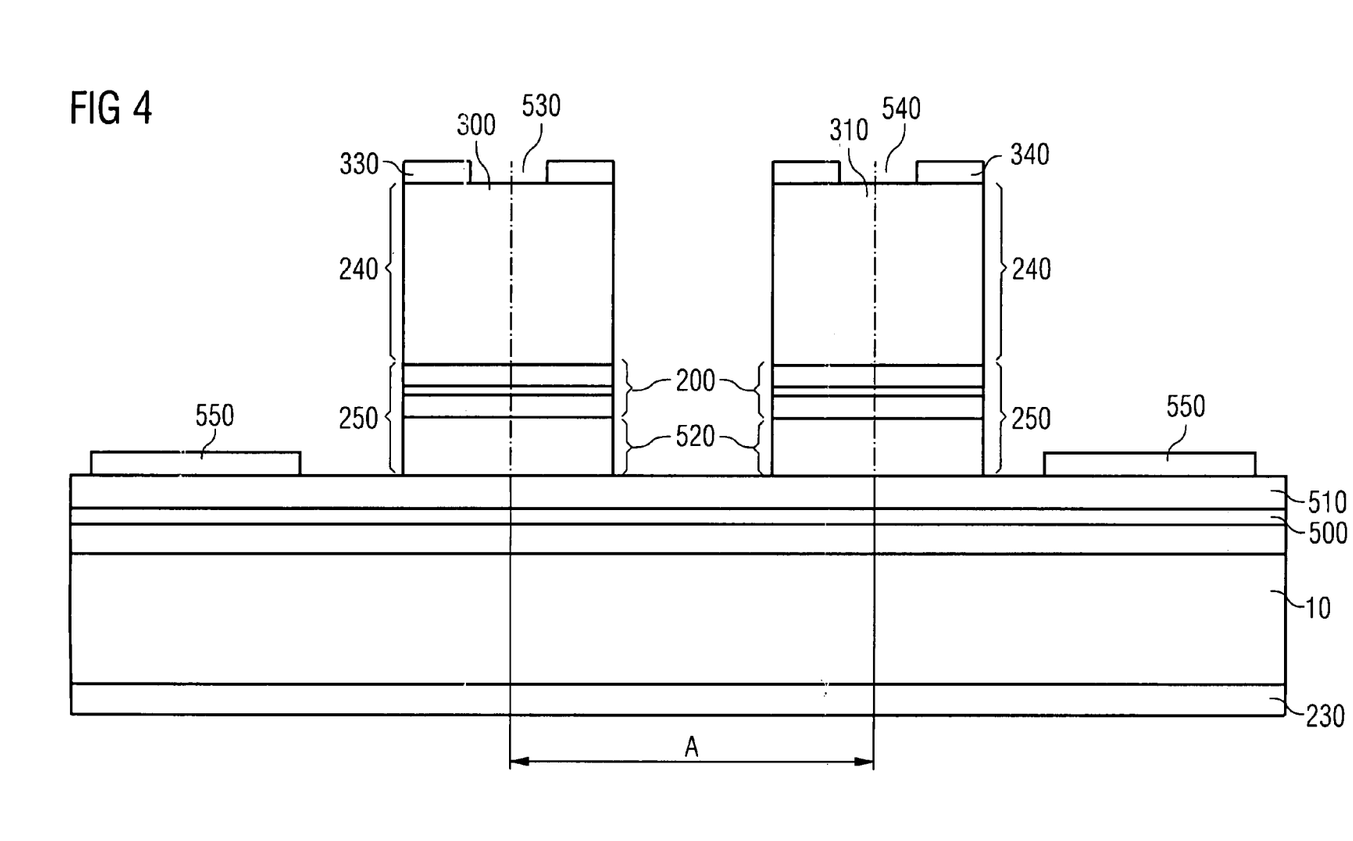

FIG. 4 illustrates the emission module in accordance with FIG. 3 in cross section. The two lasers 300 and 310 can be seen, which are arranged next to one another at a distance A. Moreover, a monitor diode layer 500 arranged on the substrate 10 can be seen, a common contact layer 510 for the lasers 300, 310 and 320 being arranged on said monitor diode layer.

Two lower mesa regions 250 are arranged on the common contact layer 510. The two lower mesa regions 250 in each case have a lower covering layer 520 and an active laser layer 200 arranged above the latter. Upper mesa regions 240 are arranged above the lower mesa regions 250.

For the purpose of electrical driving, the two annular pads 330 and 340 are in each case arranged on the upper mesa regions 240, through which pads emission windows 530 and 540 are formed.

The electrical rear contact of the two lasers 300 and 310 is formed by two connection electrodes 550 which are simultaneously used for making electrical contact with the monitor diode layer 500. The further connection contact of the monitor diode layer 500 is formed by the lower contact layer 230 arranged on the substrate rear side of the substrate 10.

In the context of the production of the emission module in accordance with FIGS. 3 and 4, firstly the upper mesa region 240 is etched by means of a dry etching method in order to achieve a smallest possible distance A between the two lasers 300 and 310. In this case, the first etching step is terminated before the active laser layer 200 is affected. In a second etching step, the lower mesa region 250 with the active laser layer 200 and the lower covering layer 520 is etched. In this case, the second etching step is carried out by means of a wet-chemical etching method in order to prevent crystal damage in the region of the etching sidewalls of the active laser layer 200, since such crystal damage might impair the electrical and optical behavior of the lasers.

Moreover, the second etching step is furthermore important in order to sever (separate) the active laser layer between the lasers 300, 310 and 320. This is because if crystal damage occurs in one of the lasers during laser production, then, in the case of an uninterrupted laser layer, said crystal damage might "migrate" through the entire active laser layer 200 to other lasers such that a "dislocation network" would be formed. The severing of the active laser layer 200 between the lasers of the emission module reliably prevents such migration of crystal dislocations from laser to laser.

As can be gathered from FIG. 4, the monitor diode layer 500 and also the common contact layer 510 are not severed, so that both the lasers 300, 310 and 320 and the monitor diode layer 500 can be driven by means of the connection electrodes 550. The monitor diode layer 500 is thus assigned to all three lasers 300, 310 and 320, so that the optical "summation signal" or total light signal formed by the three lasers 300, 310 and 320 is measured by the monitor diode 430 formed by the monitor diode layer 500. Individual measurement of the individual signals of the three lasers 300, 310 and 320 is not possible with the continuous monitor diode layer 500 or the monitor diode 430.

At least one mirror layer in the upper mesa region 240 and a mirror layer in the lower covering layer 520 and/or in the substrate 10 are advantageous for laser operation. The reflectivities of the mirror layers are in total preferably at least 99%. With regard to the configuration of the mirror layers, reference is made to the above explanations in connection with the exemplary embodiment in accordance with FIG. 2, in which mirror layers are arranged in the upper covering layer 210 and in the substrate 10.

Figure 5:
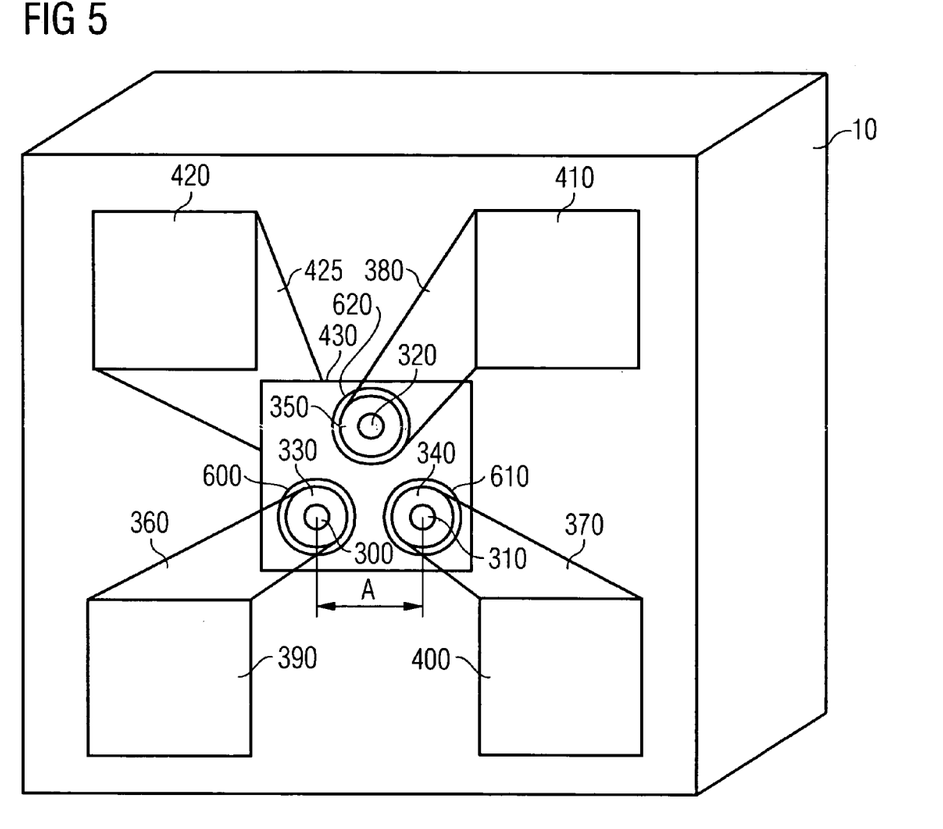
FIGS. 5 and 6 show an exemplary embodiment of an emission module according to the invention with three vertically emitting lasers and with steps between the mesa regions.

FIG. 5 shows an exemplary embodiment of an emission module with "triple" redundancy and with steps between mesa regions.

Three lasers 300, 310 and 320 with their annular connection pads 330, 340 and 350 can be seen. In contrast to the exemplary embodiment in accordance with FIGS. 3 and 4, steps 600, 610 and 620 can furthermore be seen in FIG. 5. Said steps 600, 610 and 620 are formed between the upper and lower mesa regions of the lasers. This is explained in connection with FIG. 6.

For the rest, the construction of the emission module in accordance with FIG. 5 corresponds to the construction of the emission module in accordance with FIG. 3.

Figure 6:
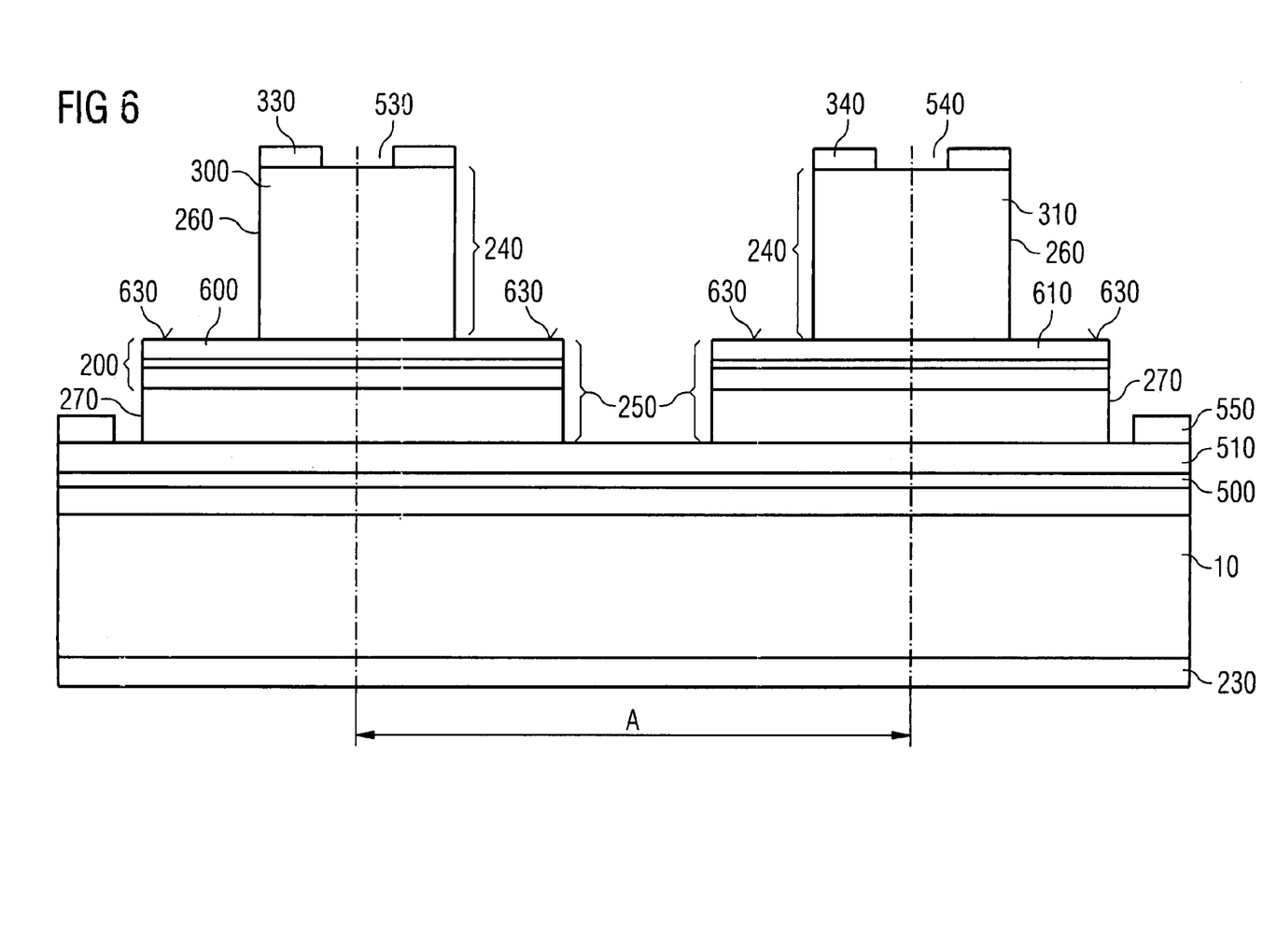

FIG. 6 illustrates the emission module in accordance with FIG. 5 in cross section. The two lasers 300 and 310 with their upper mesa regions 240 and their lower mesa regions 250 can be seen.

In contrast to the exemplary embodiment in accordance with FIGS. 3 and 4, a respective step is provided between the upper mesa regions 240 and the lower mesa regions 250 in the case of the exemplary embodiment in accordance with FIGS. 5 and 6. These are the two steps 600 and 610 in the illustration in accordance with FIG. 6.

The two steps 600 and 610 are formed during the production of the two mesa regions 240 and 250 by a further masking step being carried out after the first etching step has been carried out and after the upper mesa regions 240 have been formed. In concrete terms, the surface 630 uncovered after the first etching step has been carried out is firstly passivated by oxidation. The oxidation layer formed in this case is opened in the region outside the upper mesa regions 240, and the second etching step is subsequently carried out. In this case, the opening in the oxidation layer formed on the uncovered surface 630 is dimensioned and arranged in such a way that the steps 600 and 610 illustrated in FIG. 6 are formed.

The steps are formed by the upper mesa regions 240 and also those regions of the uncovered surface 630 which directly adjoin the upper mesa regions 240 remaining covered when the second etching step is carried out, in such a way that said regions are not attacked during the second etching step. Consequently, in the context of the second etching step, etching sidewalls 270 are exclusively formed in the outer edge region of the lower mesa region 250.

The etching sidewalls 270 are thus arranged far away from the center region of the lower mesa region 250. This remote arrangement of the etching sidewalls 270 in the lower mesa region has the advantage that crystal damage that possibly occurs in the region of the etching sidewalls 270 is as far away as possible from the electrically and optically active center region of the lower mesa region 250 and the influence of said damage on the behavior of the lasers is thus largely reduced.

What is furthermore achieved by the passivation of the uncovered surface 630 in the context of the oxidation step is the passivation of the etching sidewalls 260 in the upper mesa region 240, thereby distinctly avoiding an undesired charge carrier recombination in the region of the etching sidewalls 260. The reduction of the overall recombination reduces the current consumption of the lasers, thereby increasing the lifetime of the lasers.

For the rest, the emission module in accordance with FIGS. 5 and 6 corresponds to the emission module in accordance with FIGS. 3 and 4. Thus, the emission module in accordance with FIGS. 5 and 6 also has a monitor diode layer 500 with which contact is made by the connection electrodes 550 via a common contact layer 510. In this case, the connection electrodes 550 additionally serve for electrically driving the lasers 300, 310 and 320.

As can be seen in FIG. 6, the monitor diode layer 500 is arranged below the lasers in whole-area fashion, so that only the light summation signal formed by the three lasers 300, 310 and 320 can be measured and evaluated by means of the monitor diode 430 formed by the monitor diode layer 500.

Figure 7:
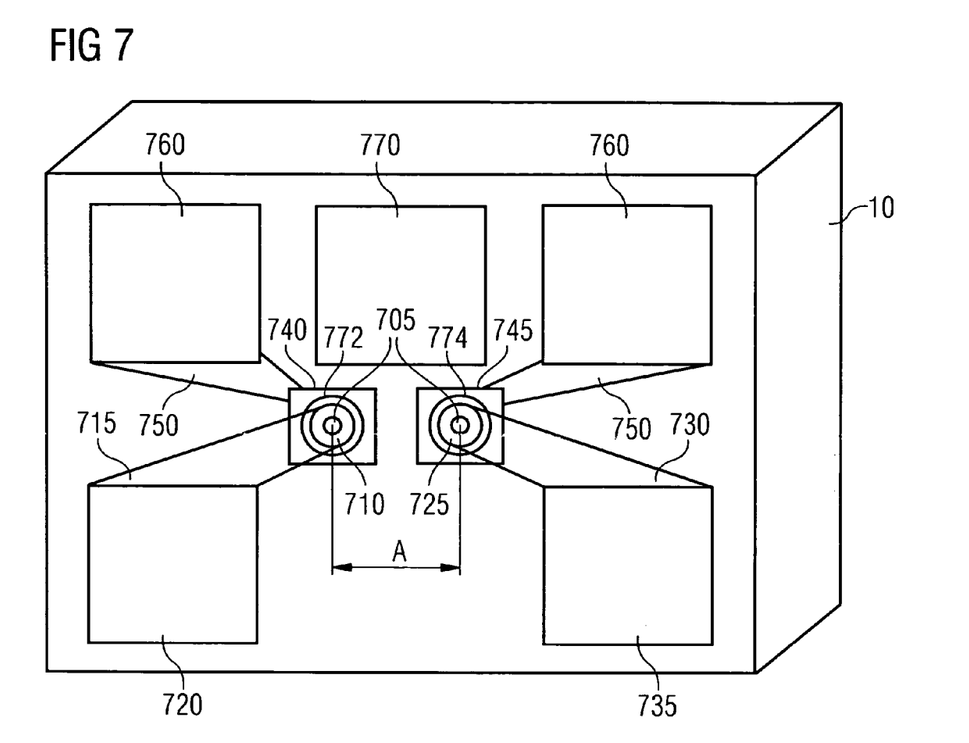
FIGS. 7 and 8 show an exemplary embodiment of an emission module according to the invention with a common monitor diode and with separate rear contacts for the lasers.

FIG. 7 shows a further exemplary embodiment of an emission module with double redundancy.

The emission module has a substrate 10, in which two electrically isolated lasers 700 and 705 are integrated. One of the two lasers 700 has an annular pad 710, which is connected to a connection pad 720 via a connection line 715.

The other laser 705 likewise has an annular pad, identified by the reference symbol 725 in FIG. 7. This annular pad 725 is connected to a connection pad 735 via a connection line 730.

The two lasers 700 and 705 furthermore have individual rear contacts 740 and 745, which can be driven individually via connection lines 750 and connection pads 760.

FIG. 7 furthermore shows a connection pad 770, which can be used to drive a monitor diode of the emission module.

The lasers 700 and 705 have steps 772 and 774 corresponding to the steps 600, 610 and 620 which have already been explained in connection with FIGS. 5 and 6.

Figure 8:
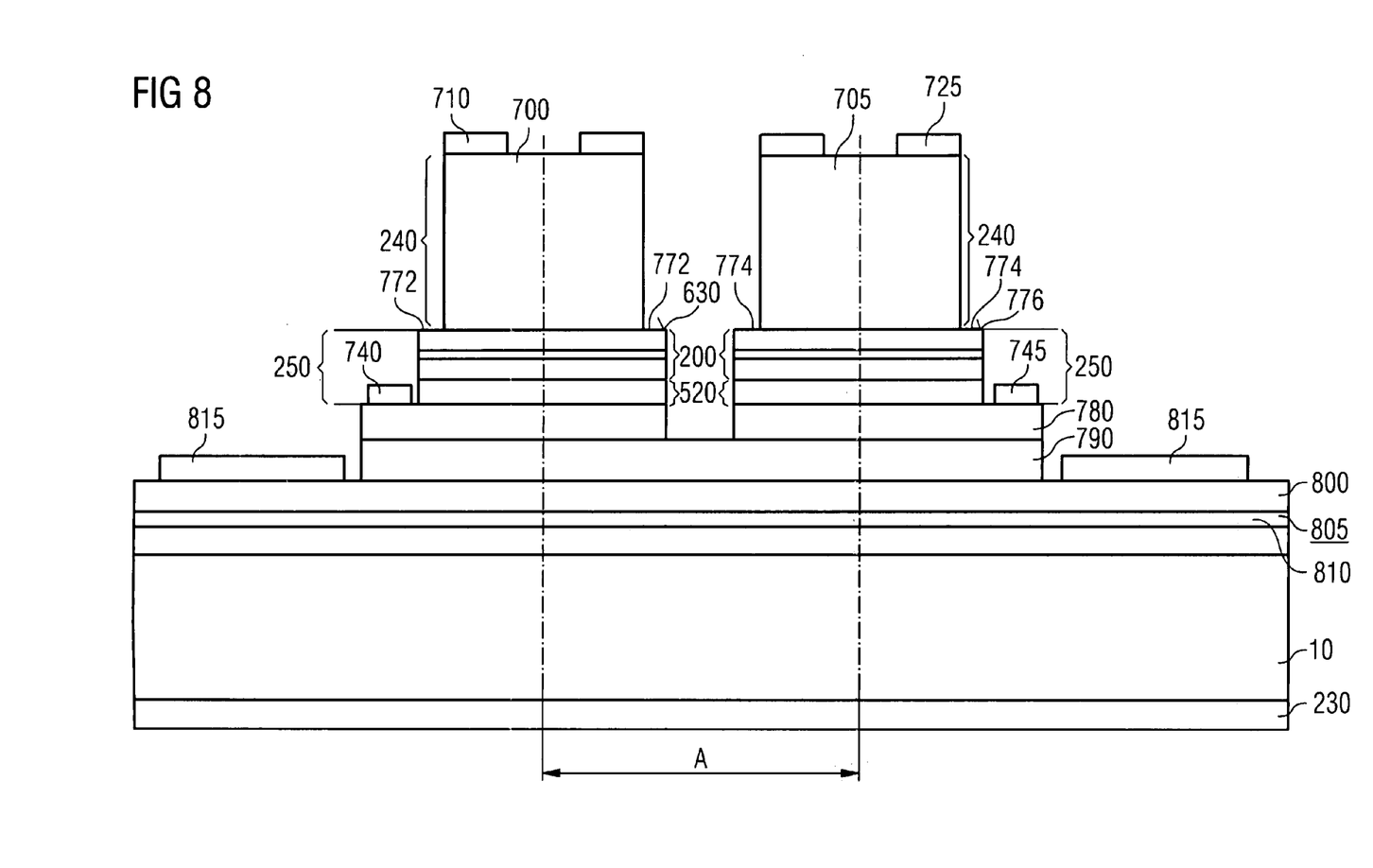

FIG. 8 illustrates the emission module in accordance with FIG. 7 in cross section. The two lasers 700 and 705 can be seen, which each have an upper mesa region 240 and a lower mesa region 250. The two upper mesa regions 240 have in each case been etched in a first etching step. The two lower mesa regions 250 have been etched in a second etching step, which is a chemical etching step, in order to prevent crystal damage in the region of an active laser layer 200 in the lower mesa region 250.

The steps 772 and 774 are formed between the two mesa regions 240 and 250. The two steps 772 and 774 are formed by a further masking step being carried out after the first etching step has been carried out and after the upper mesa regions 240 have been formed. In concrete terms the surface 776 uncovered after the first etching step has been carried out is firstly passivated by oxidation. The oxidation layer formed in this case is opened in the region outside the upper mesa regions 240, and the second etching step is subsequently carried out. In this case, the opening in the oxidation layer formed on the uncovered surface 776 is dimensioned and arranged in such a way that the steps 772 and 774 illustrated in FIG. 8 are formed. Moreover, with regard to the steps and the advantages afforded by the steps, reference is made to the explanations in connection with FIG. 6.

With regard to the steps, it shall be mentioned at this juncture only that the steps 600, 610 and 620 in accordance with FIG. 6 and the steps 772 and 774 in accordance with FIG. 8 do not have to be arranged directly above the active layer 200. As an alternative, one or a plurality of additional layers may be arranged above the active layer 200 in the lower mesa region 250, said additional layers separating the active layer 200 and the steps 600, 610, 620, 772 and 774 from one another. Such an additional layer above the active layer 200 affords the advantage that the etching depth can fluctuate when carrying out the first etching step without etching into the active laser layer 200.

As can be seen in FIG. 8, the two lower mesa regions 250 additionally have a lower covering layer 520 arranged below the active laser layer 200. Situated below the lower covering layer 520 is a contact layer 780, which is severed in the region between the two lasers 700 and 705. The two individual rear contacts 740 and 745, which are respectively assigned to one of the two lasers 700 and 705, are arranged on the contact layer 780.

Arranged below the contact layer 780 is an insulation or barrier layer 790, which bears directly on an upper contact layer 800 of a monitor diode 805. The monitor diode 805 additionally has an "active" monitor diode layer 810, which extends below the two laser diodes 700 and 705 in whole-area fashion.

Contact is made with the upper contact layer 800 of the monitor diode 805 by electrodes 815, which are connected to the monitor diode connection pad 770 in accordance with FIG. 7. The second connection or ground connection of the monitor diode 805 is formed by the lower contact layer 230 of the substrate 10.

The emission module in accordance with FIGS. 7 and 8 is produced in the context of a two-stage etching method in which the upper mesa region 240 of the lasers 700 and 705 is subjected to dry etching. The lower mesa regions 250, in which the lower covering layer 520 and the active laser layer 200 are situated, are etched by means of a chemical etching step. The contact layer 780 can then be separated by means of an arbitrary etching method.

The emission module in accordance with FIGS. 7 and 8 enables the two lasers 700 and 705 to be driven in a manner electrically isolated from one another. The monitor diode 805 assigned to the two lasers 700 and 705 is also electrically isolated from the two lasers 700 and 705 by the barrier layer 790.

Figure 9:
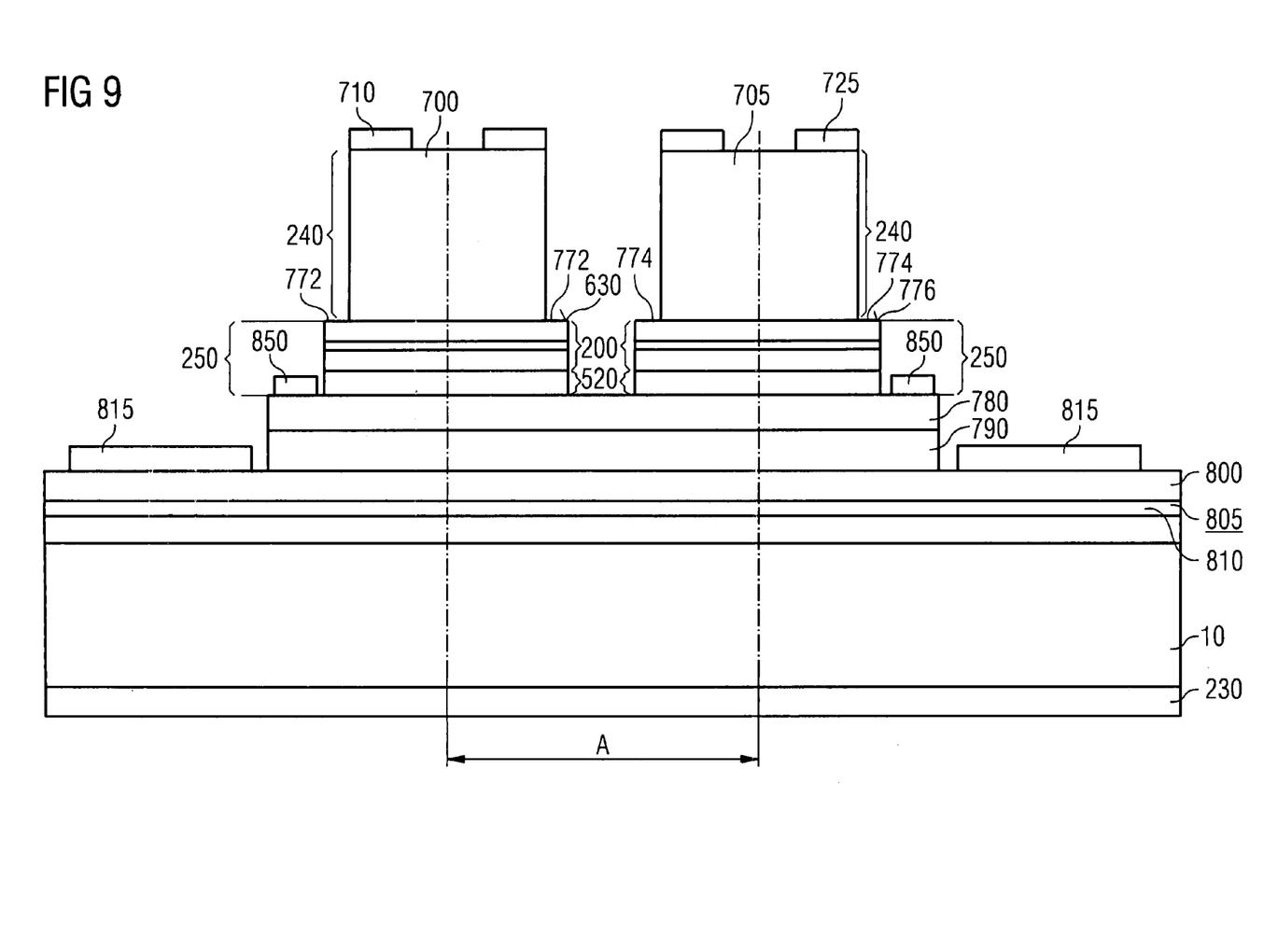
FIG. 9 shows an exemplary embodiment of an emission module according to the invention with a common monitor diode and with a common rear contact for the lasers.

FIG. 9 shows a fifth exemplary embodiment of an emission module. The exemplary embodiment in accordance with FIG. 9 corresponds to the exemplary embodiment in accordance with FIG. 8 with the difference that the contact layer 780 is not severed between the two lasers 700 and 705. The two lasers 700 and 705 thus have a common rear contact 850 and are not electrically isolated. Therefore, an additional etching step for severing the contact layer 780 is not necessary.

For the rest, the fifth exemplary embodiment in accordance with FIG. 9 corresponds to the exemplary embodiment in accordance with FIG. 8.

Figure 10:
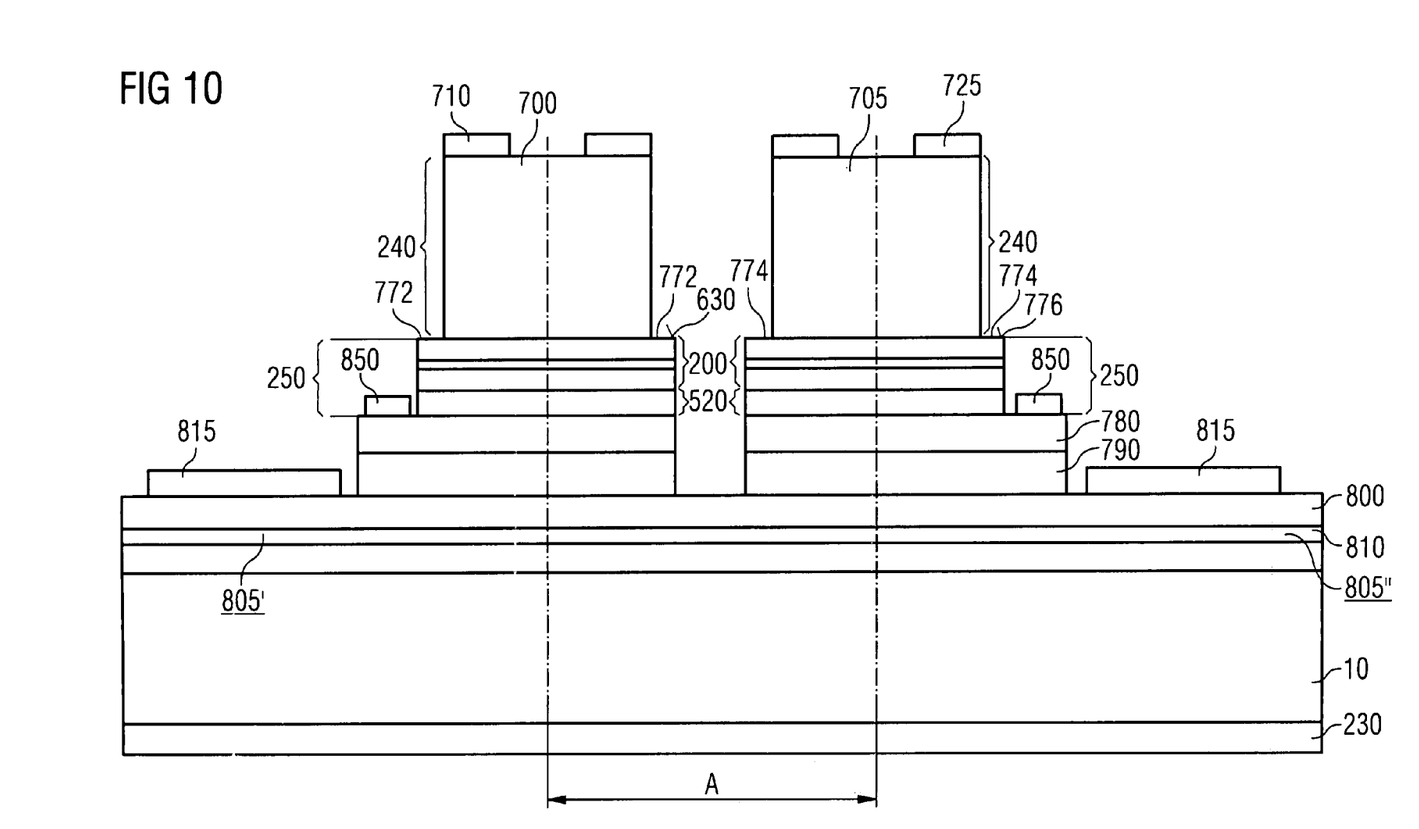
FIG. 10 shows an exemplary embodiment of an emission module according to the invention with electrically isolated lasers and separate monitor diodes.

FIG. 10 shows a sixth exemplary embodiment of an emission module. In terms of the layer construction, the sixth exemplary embodiment corresponds to the two exemplary embodiments in accordance with FIGS. 7 to 9, so that reference is made to the above explanations in this regard.

In contrast to the exemplary embodiment in accordance with FIG. 8, the insulation or barrier layer 790 and also the upper monitor diode contact layer 800 are additionally severed in the case of the exemplary embodiment in accordance with FIG. 10. This separation can be effected in one or a plurality of separate etching steps.

The separation of the contact layer 780 enables the lasers 700 and 705 to be driven separately, as has already been explained above in connection with FIG. 8.

On account of the separation of the insulation or barrier layer 790 and the upper monitor diode contact layer 800, two separate monitor diodes 805' and 805" are formed, which can be driven separately and whose photocurrents can be "read out" and evaluated separately.

With regard to the production method for producing the emission module in accordance with FIG. 10, moreover, reference is made to the above explanations, in particular in connection with FIGS. 7 to 9.

The invention claimed is:

1. A method for producing an optical emission module having at least two vertically emitting lasers, the method comprising:
    forming an optically active laser layer on a substrate and at least one upper covering layer on said optically active laser layer,
    in a first etching step, etching an upper mesa region for each of the vertically emitting lasers to be produced, wherein the etching depth of the first etching step is selected such that the first etching step is terminated before the optically active laser layer is exposed, and wherein the first etching step is carried out in such a way that a resulting distance between the upper mesa regions of the respective vertically emitting lasers is so small that the radiation generated by the finished produced lasers can be coupled directly into a single optical waveguide, and
    in a second etching step, severing the optically active laser layer to form lower mesa regions, the second etching step being performed using one of a wet-chemical and a dry-chemical etching process using a predominantly chemical etching component.

2. The method as claimed in claim 1, wherein the first etching step comprises utilizing a dry-chemical etching process using a predominantly physical etching component.

3. The method as claimed in claim 1, wherein the second etching step further comprises forming the lower mesa region with a larger area in cross section than the upper mesa region, and forming a step between the upper and lower mesa regions.

4. The method as claimed in claim 3, further comprising:
    oxidizing a surface layer uncovered after the first etching step,
    wherein the oxidized surface layer is opened outside the upper mesa regions, and
    wherein the second etching step is subsequently carried out to form the step.

5. The method as claimed in claim 1, further comprising forming a monitor diode layer on the substrate before forming the optically active laser layer.

6. The method as claimed in claim 5, further comprising severing the monitor diode layer during one of the second etching step or a subsequent etching step performed after the second etching step.

7. The method as claimed in claim 5, further comprising forming an electrical insulation layer between the monitor diode layer and the optically active laser layer.

8. The method ad claimed in claim 5, wherein the monitor diode layer remains unsevered.

9. The method as claimed in claim 1, further comprising forming at least one mirror layer below and above the optically active laser layer.

10. The method as claimed in claim 1, wherein the lasers are operated in a redundant manner.

11. A method for producing an optical emission module having at least two vertically emitting lasers, the method comprising:
    forming an active laser layer over a substrate;
    forming at least one upper covering layer over the active laser layer;
    forming a plurality of spaced-apart upper mesa regions by etching portions of said at least one upper covering layer using a first, relatively anisotropic etching process such that adjacent pairs of upper mesa regions are separated by a minimum distance, wherein the first etching process is terminated before the active laser layer is etched; and
    forming a plurality of spaced-apart lower mesa regions by etching portions of said active laser layer through said etched portions of said at least one upper covering layer using second etching process including one of a wet-chemical etching process and a dry-chemical etching process using a predominantly chemical etching component.

12. The method as claimed in claim 11, wherein the first etching process comprises a dry-chemical etching process using a predominantly physical etching component.

* * * * *